United States Patent
Hsu et al.

(10) Patent No.: US 8,921,972 B2
(45) Date of Patent: Dec. 30, 2014

(54) HIGH VOLTAGE METAL-OXIDE-SEMICONDUCTOR TRANSISTOR DEVICE

(71) Applicant: United Microelectronics Corp., Hsin-Chu (TW)

(72) Inventors: Ming-Shun Hsu, Miaoli County (TW); Ke-Feng Lin, Taipei (TW); Chiu-Te Lee, Hsinchu County (TW); Chih-Chung Wang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/896,289

(22) Filed: May 16, 2013

(65) Prior Publication Data

US 2014/0339636 A1    Nov. 20, 2014

(51) Int. Cl.
H01L 21/70 (2006.01)
H01L 29/78 (2006.01)
H01L 27/092 (2006.01)
H01L 27/085 (2006.01)
H01L 27/088 (2006.01)

(52) U.S. Cl.
CPC ........ *H01L 29/7816* (2013.01); *H01L 27/0922* (2013.01); *H01L 27/085* (2013.01); *H01L 27/088* (2013.01)
USPC .......................................... 257/500; 257/501

(58) Field of Classification Search
CPC .. H01L 27/0922; H01L 27/085; H01L 27/088
USPC .................................................. 257/500, 501
See application file for complete search history.

(56) References Cited

U.S. PATENT DOCUMENTS

| 2006/0113627 A1* | 6/2006 | Chen et al. ............ 257/500 |
| 2008/0073745 A1* | 3/2008 | Tang et al. ............ 257/500 |
| 2013/0043513 A1* | 2/2013 | Huang et al. .......... 257/288 |

OTHER PUBLICATIONS

Hsu, Title of Invention:Transistor Device and Manufacturing Method Thereof, U.S. Appl. No. 13/525,471, filed Jun. 18, 2012.

* cited by examiner

*Primary Examiner* — Phat X Cao
(74) *Attorney, Agent, or Firm* — Winston Hsu; Scott Margo

(57) ABSTRACT

A high voltage metal-oxide-semiconductor (HV MOS) transistor device includes a substrate, a drifting region formed in the substrate, a plurality of isolation structures formed in the drift region and spaced apart from each other by the drift region, a plurality of doped islands respectively formed in the isolation structures, a gate formed on the substrate, and a source region and a drain region formed in the substrate at respective two sides of the gate. The gate covers a portion of each isolation structure. The drift region, the source region, and the drain region include a first conductivity type, the doped islands include a second conductivity type, and the first conductivity type and the second conductivity type are complementary to each other.

18 Claims, 5 Drawing Sheets

HIGH VOLTAGE METAL-OXIDE-SEMICONDUCTOR TRANSISTOR DEVICE

BACKGROUND OF THE INVENTION

1. Field of the Invention

The invention relates to a high voltage metal-oxide-semiconductor (herein after abbreviated as HV MOS) transistor device, and more particularly, to a high voltage lateral double-diffused metal-oxide-semiconductor (HV-LDMOS) transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantages of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dopant concentration and large area. The drift region is used to alleviate the high voltage between the drain and the source, therefore the LDMOS transistor device can have high breakdown voltage (BVD).

It is well-known that characteristics of low ON-resistance (hereinafter abbreviated as $R_{ON}$) and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a HV MOS transistor device is provided. The HV MOS transistor device includes a substrate, a drift region, a plurality of isolation structures, a plurality of doped islands, a gate, a source region, and a drain region. The drift region is formed in the substrate. The isolation structures are formed in the drift region and spaced apart from each other by the drift region. The doped islands are formed in the isolation structures, respectively. The gate is formed on the substrate and covers a portion of each isolation structure. The source region and the drain region are formed in the substrate at respective two sides of the gate. The drift region, the source region, and the drain region include a first conductivity type, and the doped islands include a second conductivity type. The first conductivity type and the second conductivity type are complementary to each other.

According to the HV MOS transistor device provided by the present invention, the isolation structures are formed in the substrate with the doped islands respectively formed therein. Because the doped islands and the drift region include conductivity types complementary to each other, reduced surface field (RESURF effect) is obtained, and thus breakdown voltage of the HV MOS transistor is effectively increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
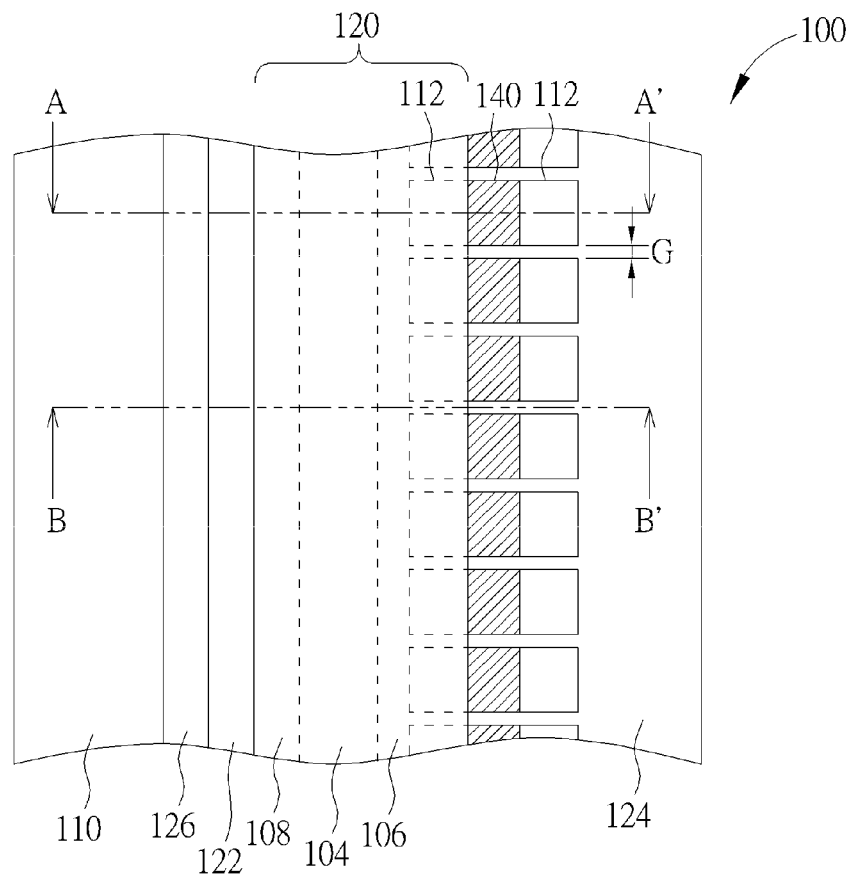
FIG. 1A is a schematic drawing illustrating a HV MOS transistor device provided by a first preferred embodiment of the present invention.
Figure 1B:
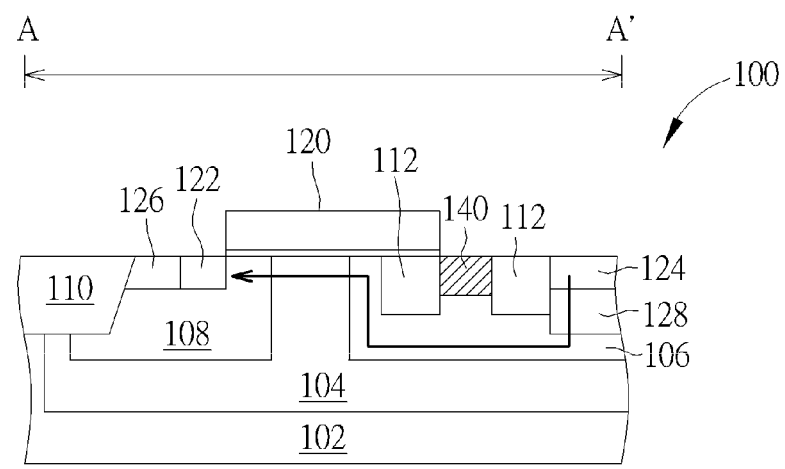
FIG. 1B is a cross-sectional view taken along a Line A-A' of FIG. 1A.
Figure 1C:
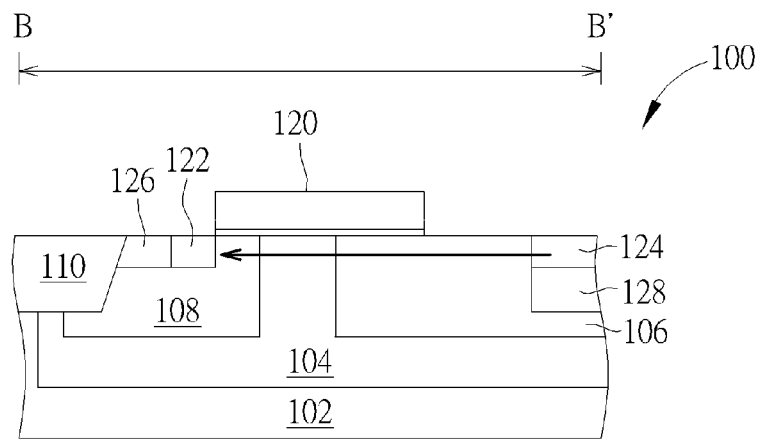
FIG. 1C is a cross-sectional view taken along a Line B-B' of FIG. 1A.

Please refer to FIGS. 1A-1C, wherein FIG. 1A is a schematic drawing illustrating a HV MOS transistor device provided by a first preferred embodiment of the present invention, FIG. 1B is a cross-sectional view taken along a Line A-A' of FIG. 1A, and FIG. 1C is a cross-sectional view taken along a Line B-B' of FIG. 1A. As shown in FIGS. 1A-1C, a HV MOS transistor device 100 provided by the preferred embodiment includes a substrate 102, such as a silicon substrate. The substrate 102 includes a deep well 104 formed therein, and the deep well 104 includes a drift region 106 and a body region 108 formed therein. As shown in FIGS. 1A-1C, the drift region 106 and the body region 108 are spaced apart from each other by the deep well 104. The deep well 104 and the drift region 106 include a first conductivity type while the substrate 102 and the body region 108 include a second conductivity type. The first conductivity type and the second conductivity type are complementary to each other. In the preferred embodiment, the first conductivity type is an n type and the second conductivity type is a p type. The substrate 102 further includes a plurality of isolation structures 110 for electrically isolating the HV MOS transistor device 100 from other devices and a plurality of isolation structures 112 formed in the drift region 106. According to the preferred embodiment, the isolation structures 110 and the isolation structures 112 include shallow trench isolation (hereinafter abbreviated as STI), but not limited to this. As shown in FIG. 1A, the isolation structures 112 are spaced apart from each other by the drift region 106. Accordingly, each of the isolation structures 112 includes an islanding shape. Furthermore, the islanding isolation structures 112 are separated and spaced apart from each other by a gap G, and the gap G is filled with the drift region 106.

Please refer to FIGS. 1A-1C again. The HV MOS transistor device 100 provided by the preferred embodiment includes a gate 120 formed on the substrate 102. The gate 120 covers a portion of each isolation structure 112. As shown in FIG. 1A, the isolation structures 112 are arranged along a direction parallel with a direction in which the gate 120 extends. A source region 122 and a drain region 124 are formed in the substrate 102 at respective two sides of gate 120. The source region 122 and the drain region 124 both include the first conductivity type. Accordingly, the preferred embodiment provides an n-source region 122 and an n-drain region 124. As shown in FIGS. 1B-1C, the n-source region 122 is formed in the p-body region 108. Furthermore, a p-doped region 126, which is complementary to the n-source region 122, is formed in the p-body region 108. And the p-doped region 126 is electrically connected to the n-source region 122. Additionally, the HV MOS transistor device 100 provided by the preferred embodiment further includes an n-well 128 formed in the drift region 106. In the preferred embodiment, a dopant concentration of the n-well 128 is larger than a dopant concentration of the drift region 106, and the dopant concentration of the drift region 106 is larger than a dopant concentration of the deep well 104. As shown in FIGS. 1B and 1C, the drain region 124 is formed in the n-well 128.

Please still refer to FIGS. 1A-1C. More important, the HV MOS transistor device 100 provided by the preferred embodiment includes a plurality of doped islands 140 formed in the isolation structures 112, respectively. The doped islands 140 are floated in each isolation structure 112. The doped islands 140 include the second conductivity type, therefore the preferred embodiment provides the p-doped islands 140. As shown in FIGS. 1B-1C, a depth of the doped islands 140 is smaller than a depth of the isolation structures 112. However, it is noteworthy that each of the doped islands 140, which is sandwiched between the isolation structures 112, includes a bottom and a pair of opposite sidewalls physically contact the drift region 106.

Please refer to FIGS. 1B and 1C again. When the HV MOS transistor device 100 is in the operation state, current flows from the drain region 124 to the source region 122 on two routes. The first route is as shown in FIG. 1B, the current flows from the drain region 124 to the source region 122 by passing through the n-well 128, the drift region 106 under the isolation structures 112 and the doped islands 140, the deep well 104, and the body region 106. Because the p-doped islands 140 and the n-drift region 106 are alternately arranged, a specific p-n-p structure is obtained and a Reduced Surface Field (hereinafter abbreviated as RESURF) effect which increases the breakdown voltage is resulted. More important, since the depth of the doped islands 140 is smaller than the depth of the isolation structures 112, current path is reduced and thus $R_{ON}N$ of the HV MOS transistor device 100 is reduced. On the other hand, the alternative route of the current is as shown in FIG. 1C: The current flows from the drain region 124 to the source region 122 directly passing the drift region 106 between the isolation structures 112, the deep well 104, and the body region 106. Accordingly, the drift region 106 interrupting and separating the isolation structures 112 serves as a bridge that allows current pass through. In other words, the second route provides an even shorter current path, and $R_{ON}$ of the HV MOS transistor device 100 is further reduced.

Figure 2:
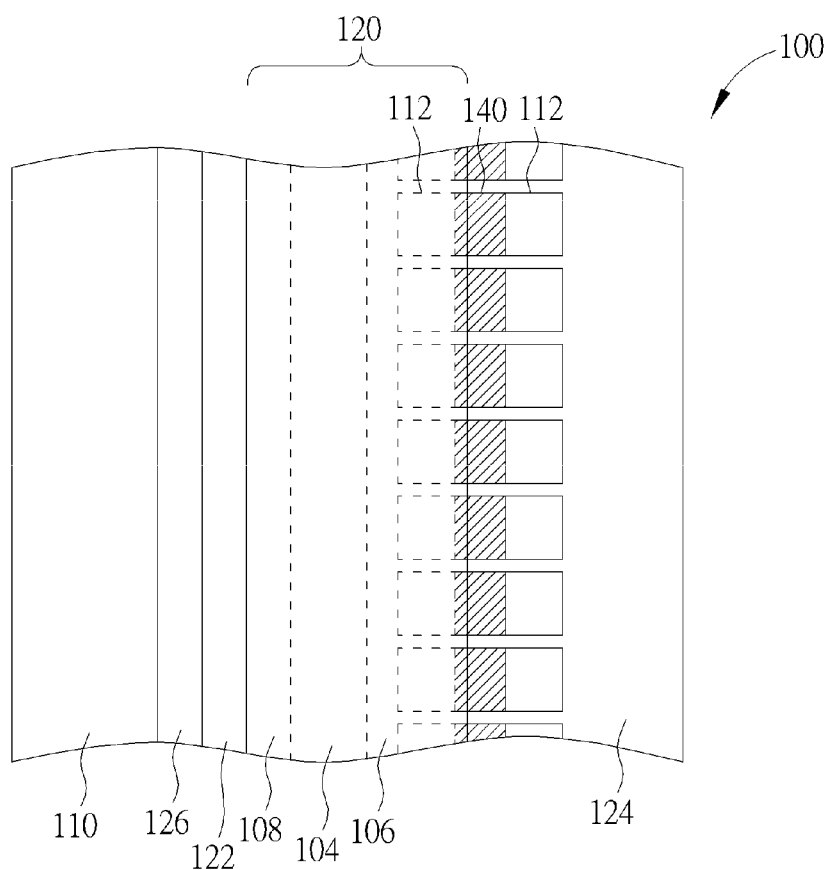
FIG. 2 is a schematic drawing illustrating a modification to the first preferred embodiment.

Please refer to FIG. 2, which is a schematic drawing illustrating a modification to the preferred embodiment. It should be noted that elements the same in the first preferred embodiment and the modification are designated by the same numerals, and include the same conductivity types. Therefore, those details are omitted herein in the interest of brevity. As shown in FIG. 2, the difference between the modification and the first preferred embodiment is: The gate 120 provided by the modification covers not only a portion of each isolation structure 112, but also a portion of each doped island 140.

According to the HV MOS transistor device 100 provided by the first preferred embodiment and its modification, the drift region 106 is formed to separate and space apart the islanding isolation structures 112, in which the floating doped island 140 is respectively formed. Therefore, RESURF effect is obtained by the alternately arranged p-doped islands 140 and n-drift region 106, and thus breakdown voltage is increased. Furthermore, by providing the doped islands 140 having depth smaller than the isolation structures 112, the current path is reduced and thus $R_{ON}$ is reduced. Furthermore, by providing the n-drift region 106, which is formed in between the isolation structured 112, serving as a bridge, an even shorter current path is obtained. Accordingly, $R_{ON}$ is further reduced. Briefly speaking, the HV MOS transistor device 100 provided by the preferred embodiment has advantages of higher breakdown voltage and lower $R_{ON}$ concurrently. Additionally, since the gate 120 can be formed to cover the portion of each doped island 140 according to the modification, the HV MOS transistor device 100 of the preferred embodiment further possesses superior process tolerance.

Figure 3A:
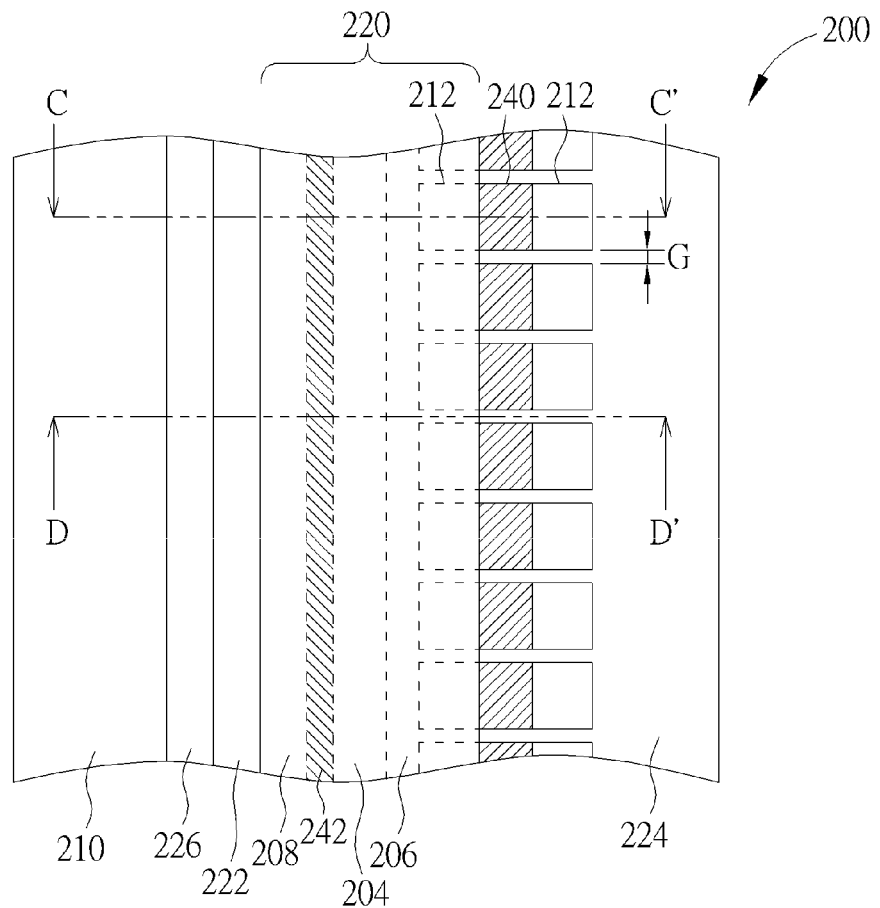
FIG. 3A is a schematic drawing illustrating a HV MOS transistor device provided by a second preferred embodiment of the present invention.
Figure 3B:
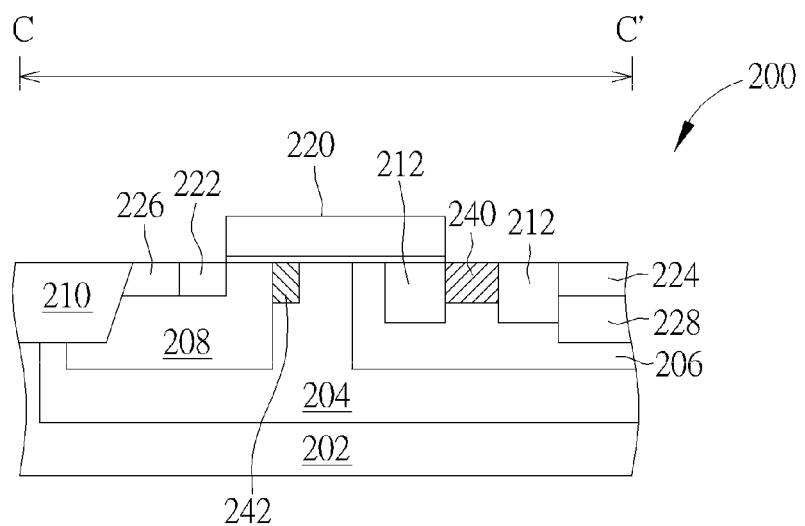
FIG. 3B is a cross-sectional view taken along a Line C-C' of FIG. 3A.
Figure 3C:
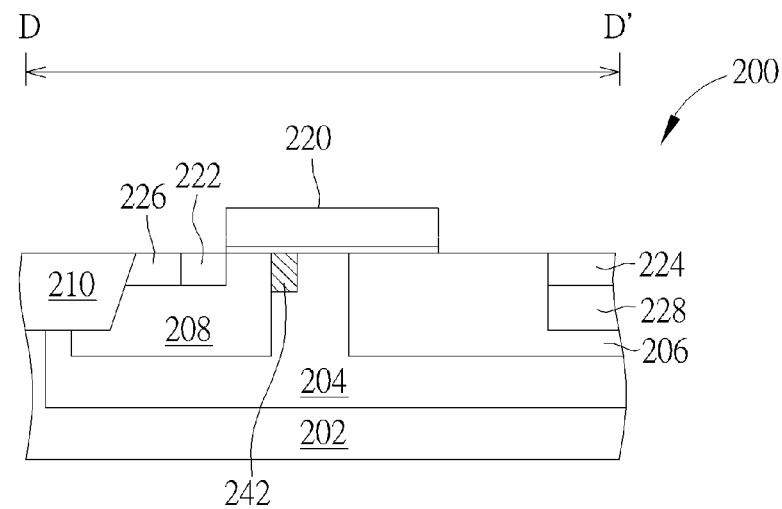
FIG. 3C is a cross-sectional view taken along a Line D-D' of FIG. 3A.

Please refer to FIGS. 3A-3C, wherein FIG. 3A is a schematic drawing illustrating a HV MOS transistor device provided by a second preferred embodiment of the present invention, FIG. 3B is a cross-sectional view taken along a Line C-C' of FIG. 3A, and FIG. 3C is a cross-sectional view taken along a Line D-D' of FIG. 3A. It should be noted that elements the same in the first and second preferred embodiments can include the same conductivity types and materials; therefore those details are omitted herein in the interest of brevity. As shown in FIGS. 3A-3C, a HV MOS transistor device 200 provided by the preferred embodiment includes a substrate 202, and the substrate 202 includes a deep well 204 formed therein. The deep well 204 includes a drift region 206 and a body region 208 formed therein. As shown in FIGS. 3A-3C, the drift region 206 and the body region 208 are spaced apart from each other by the deep well 204. The substrate 202 further includes a plurality of isolation structures 210 for electrically isolating the HV MOS transistor device 200 from other devices and a plurality of isolation structures 212 formed in the drift region 206. According to the preferred embodiment, the isolation structures 210 and the isolation structures 212 include STI, but not limited to this. As shown in FIG. 3A, the isolation structures 212 are spaced apart from each other by the drift region 206. Accordingly, each of the isolation structures 212 includes an islanding shape. Furthermore, the islanding isolation structures 212 are separated and spaced apart from each other by a gap G, and the gap G is filled with the drift region 206.

Please refer to FIGS. 3A-3C again. The HV MOS transistor device 200 provided by the preferred embodiment includes a gate 220 formed on the substrate 202. The gate 220 covers a portion of each isolation structure 212. As shown in FIG. 3A, the isolation structures 212 are arranged along a direction parallel with a direction in which the gate 220 extends. A source region 222 and a drain region 224 are formed in the substrate 202 at respective two sides of gate 220. As shown in FIGS. 3B-3C, the source region 222 is formed in the body region 208. Furthermore, a p-doped region 226, which is complementary to the source region 222, is formed in the body region 208. And the p-doped region 226 is electrically connected to the source region 222. Additionally, the HV MOS transistor device 200 provided by the preferred embodiment includes an n-well 228 formed in the drift region 206. As shown in FIGS. 3B and 3C, the drain region 224 is formed in the n-well 228.

Please still refer to FIGS. 3A-3C. The HV MOS transistor device 200 provided by the preferred embodiment includes a plurality of doped islands 240 formed in the isolation structures 212, respectively. The doped islands 240 are floated in each isolation structure 212. The doped islands 240 are p type. As shown in FIGS. 3A-3C, a depth of the doped islands 240 is smaller than a depth of the isolation structures 212. However, it is noteworthy that each of the doped islands 240, which is sandwiched between the isolation structures 212, includes a bottom and a pair of opposite sidewalls physically contact the drift region 206. Additionally, in a modification to the preferred embodiment, the gate 220 can cover a portion of each doped island 240 (not shown). More important, the HV MOS transistor device 200 provided by the preferred embodiment further includes a doped region 242 formed in the deep well 204 under the gate 220. The doped region 242 extends along a direction the same with the direction in which the gate 220 extends. Therefore, the gate 220 covers the doped region 242 entirely. The doped region 242 includes the n type. In the preferred embodiment, a dopant concentration of the n-well 228 is larger than a dopant concentration of the n-typed doped region 242, the dopant concentration of the n-typed doped region 242 is larger than a dopant concentration of the drift region 206, and the dopant concentration of the drift region 206 is larger than a dopant concentration of the deep well 204. As shown in FIGS. 3B-3C, the doped region 242 is formed near the source region 222 but spaced apart from the source region 222 by the body region 208. Furthermore, the doped region 242 is spaced apart from the drift region 206 by the deep well 204.

According to the HV MOS transistor device 200 provided by the second preferred embodiment, the drift region 206 is formed to separate and space apart the islanding isolation structures 212, in which the floating doped island 240 is respectively formed. Therefore, RESURF effect is obtained by the alternately arranged p-doped islands 240 and n-drift region 206, and thus breakdown voltage is increased while $R_{ON}$ is reduced. Furthermore, by providing the n-drift region 206, which is formed in between the isolation structures 212, serving as the bridge, an even shorter current path is obtained. Accordingly, $R_{ON}$ is further reduced. Moreover, in order to further reduce $R_{ON}$, the preferred embodiment provides the doped region 242 under the gate 220 and near the source side. Briefly speaking, the HV MOS transistor device 200 provided by the preferred embodiment has advantages of higher breakdown voltage and lower $R_{ON}$ concurrently.

Figure 4A:
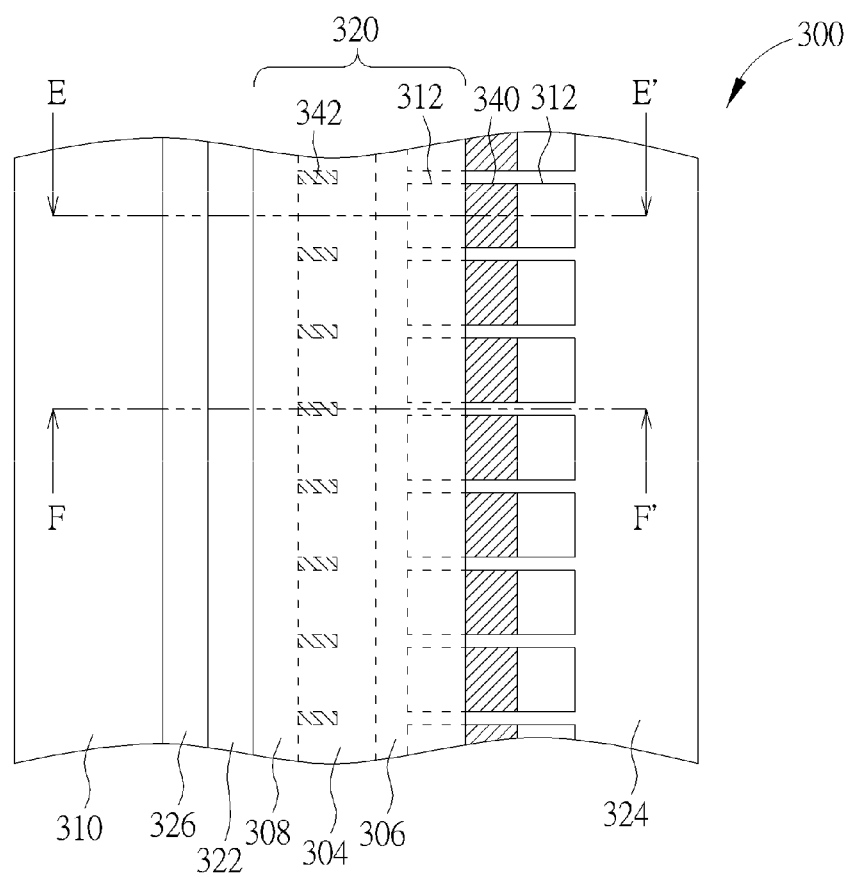
FIG. 4A is a schematic drawing illustrating a HV MOS transistor device provided by a third preferred embodiment of the present invention.
Figure 4B:
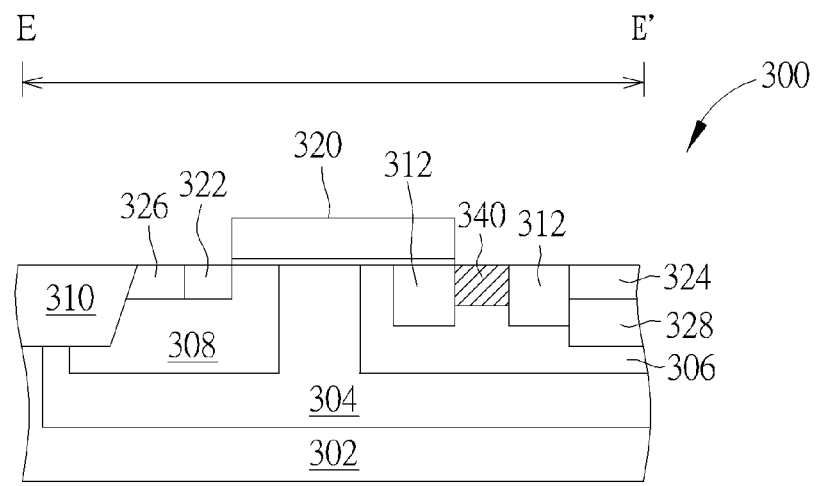
FIG. 4B is a cross-sectional view taken along a Line E-E' of FIG. 4A.
Figure 4C:
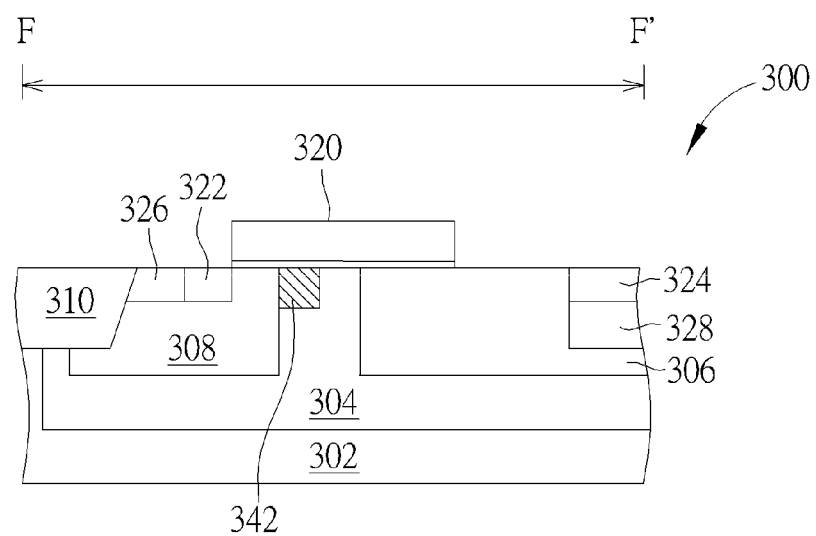
FIG. 4C is a cross-sectional view taken along a Line F-F' of FIG. 4A.

Please refer to FIGS. 4A-4C, wherein FIG. 4A is a schematic drawing illustrating a HV MOS transistor device provided by a third preferred embodiment of the present invention, FIG. 4B is a cross-sectional view taken along a Line E-E' of FIG. 4A, and FIG. 4C is a cross-sectional view taken along a Line F-F' of FIG. 4A. It should be noted that elements the same in the third and aforementioned preferred embodiments can include the same conductivity types and materials; therefore those details are omitted herein in the interest of brevity. As shown in FIGS. 4A-4C, a HV MOS transistor device 300 provided by the preferred embodiment includes a substrate 302, and the substrate 302 includes a deep well 304 formed therein. The deep well 304 includes a drift region 306 and a body region 308 formed therein. As shown in FIGS. 4A-4C, the drift region 306 and the body region 308 are spaced apart from each other by the deep well 304. The substrate 302 further includes a plurality of isolation structures 310 for electrically isolating the HV MOS transistor device 300 from other devices and a plurality of isolation structures 312 formed in the drift region 306. According to the preferred embodiment, the isolation structures 310 and the isolation structures 312 include STI, but not limited to this. As shown in FIG. 4A, the isolation structures 312 are spaced apart from each other by the drift region 306. Accordingly, each of the isolation structures 312 includes an islanding shape. Furthermore, the islanding isolation structures 312 are separated and spaced apart from each other by a gap G, and the gap G is filled with the drift region 306.

Please refer to FIGS. 4A-4C again. The HV MOS transistor device 300 provided by the preferred embodiment includes a gate 320 formed on the substrate 302. The gate 320 covers a portion of each isolation structure 312. As shown in FIG. 4A, the isolation structures 312 are arranged along a direction parallel with a direction in which the gate 320 extends. A source region 322 and a drain region 324 are formed in the substrate 302 at respective two sides of gate 320. As shown in FIGS. 4B-4C, the source region 322 is formed in the body region 308. Furthermore, a p-doped region 326, which is complementary to the source region 322, is formed in the body region 308. And the p-doped region 326 is electrically connected to the source region 322. Additionally, the HV MOS transistor device 300 provided by the preferred embodiment includes an n-well 328 formed in the drift region 306. As shown in FIGS. 4B and 4C, the drain region 324 is formed in the n-well 328.

Please still refer to FIGS. 4A-4C. The HV MOS transistor device 300 provided by the preferred embodiment includes a plurality of doped islands 340 formed in the isolation structures 312, respectively. The doped islands 340 are floated in each isolation structure 312. The doped islands 340 are p type. As shown in FIGS. 4A-4C, a depth of the doped islands 340 is smaller than a depth of the isolation structures 312. However, it is noteworthy that each of the doped islands 340, which is sandwiched between the isolation structures 312, include a bottom and a pair of opposite sidewalls physically contact the drift region 306. Additionally, in a modification to the preferred embodiment, the gate 320 can cover a portion of each doped island 340 (not shown). More important, the HV MOS transistor device 300 provided by the preferred embodiment further includes a plurality of doped regions 342 formed in the deep well 304 under the gate 320. The doped regions 242 are arranged along a direction the same with the direction in which the gate 320 extends. Therefore, the gate 320 covers the doped regions 342 entirely. The doped regions 342 include the n type. In the preferred embodiment, a dopant concentration of the n-well 328 is larger than a dopant concentration of the n-typed doped region 342, the dopant concentration of the n-typed doped region 342 is larger than a dopant concentration of the drift region 306, and the dopant concentration of the drift region 306 is larger than a dopant concentration of the deep well 304. As shown in FIGS. 4B-4C, the doped regions 342 are formed near the source region 322 but spaced apart from the source region 322 by the body region 308. Furthermore, the doped regions 342 are spaced apart from the drift region 306 by the deep well 304. More important, each doped region 342 is formed corresponding to the gap G. Therefore, in one cross-sectional view, the HV MOS transistor device 300 includes the isolation structure 312 and the doped island 340 but lacks the doped region 342 as shown in FIG. 4B while in another cross-sectional view, the HV MOS transistor device 300 includes the doped region 342 but lacks the isolation structure 312 and the doped island 340 as shown in FIG. 4C.

According to the HV MOS transistor device 300 provided by the third preferred embodiment, the drift region 306 is formed to separate and space apart the islanding isolation structures 312, in which the floating doped island 340 is respectively formed. Therefore, RESURF effect is obtained by the alternately arranged p-doped islands 340 and n-drift region 306, and thus breakdown voltage is increased while $R_{ON}$ is reduced. Furthermore, by providing the n-drift region 306, which is formed in between the isolation structures 312, serving as the bridge, an even shorter current path is obtained. Accordingly, $R_{ON}$ is further reduced. Moreover, in order to further reduce $R_{ON}$, the preferred embodiment provides the doped regions 342 under the gate 220 near the source side and corresponding to the gaps G. Briefly speaking, the HV MOS transistor device 300 provided by the preferred embodiment has advantages of higher breakdown voltage and lower $R_{ON}$ concurrently.

Accordingly, the HV MOS transistor device provided by the present invention includes the isolation structures formed in the substrate with the doped islands respectively formed therein. Because the doped islands and the drift region include conductivity types complementary to each other, RESURF effect is obtained, and thus breakdown voltage of the HV MOS transistor is effectively increased. Furthermore, by filling the gaps between the islanding isolation structures with the drift region, which serve as a bridge for obtaining a shorter current path, $R_{ON}$ of the HV MOS transistor device is efficaciously reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage metal-oxide-semiconductor (HV MOS) transistor device comprising:
    a substrate having a drift region formed therein, the drift region comprising a first conductivity type;
    a plurality of isolation structures positioned in the drift region, the isolation structures being spaced apart from each other by the drift region;
    a plurality of doped islands respectively formed in the isolation structures, the doped islands comprising a second conductivity type, and the first conductivity type and the second conductivity type being complementary to each other;
    a gate formed on the substrate and covering a portion of each isolation structure; and
    a source region and a drain region formed in the substrate at respective two sides of the gate, the source region and the drain region comprising the first conductivity type.

2. The HV MOS transistor device according to claim 1, wherein a depth of the doped islands is smaller than a depth of the isolation structures.

3. The HV MOS transistor device according to claim 1, wherein the gate cover a portion of each doped island.

4. The HV MOS transistor device according to claim 1, wherein the doped islands physically contact the drift region.

5. The HV MOS transistor device according to claim 1, further comprising a first well and a second well formed in the substrate, the first well and the second well respectively comprise the first conductivity type.

6. The HV MOS transistor device according to claim 5, wherein the drain region is formed in the second well, and the second well and the drift region are formed in the first well.

7. The HV MOS transistor device according to claim 5, wherein a dopant concentration of the drift region is lower than a dopant concentration of the second well.

8. The HV MOS transistor device according to claim 5, further comprising a body region formed in the first well, the body region comprises the second conductivity type, and the source region is formed in the body region.

9. The HV MOS transistor device according to claim 8, wherein the body region and the drift region are spaced apart from each other by the first well.

10. The HV MOS transistor device according to claim 1, further comprising a doped region formed in the substrate near the source region, the doped region comprises the first conductivity type.

11. The HV MOS transistor device according to claim 10, wherein the gate covers the doped region entirely.

12. The HV MOS transistor device according to claim 10, wherein the doped region is spaced apart from the source region and the drift region.

13. The HV MOS transistor device according to claim 1, further comprising a plurality of doped regions formed in the substrate near the source region, the doped regions comprise the first conductivity type.

14. The HV MOS transistor device according to claim 13, further comprising a plurality of gaps formed in between the isolation structures, respectively.

15. The HV MOS transistor device according to claim 14, wherein the doped regions is formed corresponding to the gaps, respectively.

16. The HV MOS transistor device according to claim 14, wherein the gaps are filled with the drift region.

17. The HV MOS transistor device according to claim 13, wherein the gate covers the doped regions.

18. The HV MOS transistor device according to claim 13, wherein the doped regions are spaced apart from the source region and the drift region.

* * * * *